US012571834B2

(12) United States Patent
Lin et al.

(10) Patent No.: US 12,571,834 B2
(45) Date of Patent: Mar. 10, 2026

(54) CIRCUIT BOARD DETECTION DEVICE

(71) Applicant: MPI Corporation, Hsinchu County (TW)

(72) Inventors: Wen-Wei Lin, Hsinchu County (TW); Wen-Chung Lin, Hsinchu County (TW); Chia-Nan Chou, Hsinchu County (TW); Huang-Huang Yang, Hsinchu County (TW); Yu-Tse Wang, Hsinchu County (TW); Wei-Heng Hung, Hsinchu County (TW); Ya-Hung Lo, Hsinchu County (TW); Shou-Jen Tsai, Hsinchu County (TW); Fuh-Chyun Tang, Hsinchu County (TW)

(73) Assignee: MPI CORPORATION, Chu-Pei City (TW)

( * ) Notice: Subject to any disclaimer, the term of this patent is extended or adjusted under 35 U.S.C. 154(b) by 137 days.

(21) Appl. No.: 18/406,668

(22) Filed: Jan. 8, 2024

(65) Prior Publication Data

US 2024/0248129 A1　　Jul. 25, 2024

(30) Foreign Application Priority Data

Jan. 19, 2023　(TW) ................................ 112102756

(51) Int. Cl.
*G01R 31/28*　　(2006.01)
*G01R 1/04*　　(2006.01)
*G01R 1/067*　　(2006.01)
(52) U.S. Cl.
CPC ........... *G01R 31/2808* (2013.01); *G01R 1/04* (2013.01); *G01R 1/06705* (2013.01)

(58) Field of Classification Search
None
See application file for complete search history.

(56) References Cited

U.S. PATENT DOCUMENTS 4,786,867 A * 11/1988 Yamatsu ............ G01R 1/07342
　　　　　　　　　　　　　　　　324/754.13
4,929,893 A * 5/1990 Sato ................... G01R 31/2886
　　　　　　　　　　　　　　　　324/750.19

(Continued)

FOREIGN PATENT DOCUMENTS

CN　　　　1639577 A　　7/2005
TW　　202032134 A　　9/2020
TW　　202210845 A　　3/2022

*Primary Examiner* — Richard Isla
(74) *Attorney, Agent, or Firm* — Birch, Stewart, Kolasch & Birch, LLP

(57) ABSTRACT

A circuit board detection device includes a base, a stage assembly, a first gantry support, and a first probe assembly. The stage assembly is arranged on the base and includes a linear drive module, a rotary motor, and a platform. The platform is configured to carry a circuit board and can be driven by the linear drive module to move along a first axial direction. The platform can also be driven by the rotary motor to rotate relative to a first rotation axis. The first gantry support is fixed on the base and includes a first beam. The first beam extends along a second axial direction perpendicular to the first axial direction to span over the linear drive module, and includes a first probe guide rail. The first probe assembly is arranged on the first probe guide rail to be movable along the second axial direction.

11 Claims, 11 Drawing Sheets

(56) References Cited

U.S. PATENT DOCUMENTS

| | | | | |
|---|---|---|---|---|
| 4,934,064 | A * | 6/1990 | Yamaguchi | H01L 21/681 |
| | | | | 33/645 |
| 5,394,100 | A * | 2/1995 | Bohler | G01R 31/311 |
| | | | | 356/3 |
| 5,812,407 | A * | 9/1998 | Sato | G05B 19/401 |
| | | | | 700/193 |
| 11,340,259 | B2 * | 5/2022 | Watanabe | G01R 1/07364 |
| 11,454,665 | B2 * | 9/2022 | Bush | G01R 31/287 |

* cited by examiner

CIRCUIT BOARD DETECTION DEVICE

CROSS-REFERENCE TO RELATED APPLICATION

This non-provisional application claims priority under 35 U.S.C. § 119(a) to Patent Application No. 112102756 filed in Taiwan, R.O.C. on Jan. 19, 2023, the entire contents of which are hereby incorporated by reference.

BACKGROUND

Technical Field

The present invention relates to a circuit board detection device.

Related Art

A circuit board is covered with surface contacts and traces, and transmission of electronic signals in dense traces may not only generate electromagnetic signal interference, but also be interfered by external electromagnetic signals, causing errors in established transmission signals or poor functioning of an original design. In addition, during manufacturing of the circuit board, the contacts and the traces may also have defects such as disconnection and short circuits. Therefore, it is extremely necessary for the circuit board to be detected before leaving the factory.

When high-frequency signal testing is performed on a current circuit board, usually, two high-frequency probes are necessarily used to simultaneously come into contact with a to-be-tested contact on the circuit board, where one high-frequency probe comes into contact with a signal inlet of the to-be-tested contact on the circuit board, and the other probe comes into contact with a signal outlet of the to-be-tested contact on the circuit board. Pin tails of the two high-frequency probes are connected to a testing machine through a coaxial cable, so that a test signal generated by the testing machine can be transmitted to one high-frequency probe through the coaxial cable and input to the to-be-tested circuit board, and an electrical test result can be transmitted back to the testing machine through the other high-frequency probe and the coaxial cable.

As shown in a Chinese patent with a patent number of I515442 (referred to as a patent 442 below), a testing machine of a conventional circuit board detection device is arranged on the circuit board detection device, and a platform (a carrying platform 12 in a figure of the patent 442) of a stage assembly of a to-be-tested circuit board is fixed on a base of the circuit board detection device. In the circuit board detection device, a gantry support (a support 13 in the figure of the patent 442) is arranged on two first guide rails, and the gantry support may move relative to the two first guide rails, or may be defined as moving along a first axial direction. Two high-frequency probe sets are arranged on the gantry support, a second guide rail is arranged on the gantry support, and the probe sets are arranged on the second guide rail. The high-frequency probe set may move relative to a movement direction of the second guide rail, or may be defined as moving along a second axial direction. The first guide rail is perpendicular to the second guide rail. When the gantry support moves along the first axial direction, because the high-frequency probe sets are arranged on the gantry support, the high-frequency probe sets move together with the gantry support along the first axial direction.

Based on this, the gantry support is driven to move along the first axial direction, and high-frequency probe bases are driven to move along the second axial direction, so that high-frequency probes can be driven to move to to-be-tested positions on the circuit board for testing. However, in repeated "move-stop-probing" processes of the gantry support, due to an inertial factor, when high-frequency probes perform probing, the gantry support actually still shakes to a considerable extent, resulting in low stability of measurement results. If probing is performed after the gantry support is completely stationary, a decrease in production capacity is caused.

SUMMARY

In view of this, the present invention proposes a circuit board detection device that fixes a first axial direction of a gantry support to eliminate a shaking phenomenon of the gantry support, thereby improving low stability of measurement results.

However, the inventor of the present invention found that, when a circuit board is tested, the first axial direction of the gantry support does not move, which makes a probe set on the gantry support unable to come into contact with contacts of the circuit board away from the probe set, making it impossible to perform measurements of contact connection traces. Therefore, a first axial direction of a platform is necessarily movable, so that the measurements of the contact connection traces on the entire circuit board can be simultaneously performed. The first axial direction of the platform is movable, so that the circuit board can be further controlled to approach a direction of the gantry support, pass through the gantry support, or be away from the gantry support.

However, when the first axial direction of the platform is movable, the platform is required to have sufficient movable stroke along the first axial direction, to ensure that the probe set on the gantry support can measure all the contact connection traces on the circuit board. Further, in the first axial direction, a width of a movable distance of the platform is at least greater than or equal to twice a width of the platform, to meet a moving stroke requirement of the platform. Compared with an architecture in which the traditional gantry support can move along the first axial direction, the inventor of the present invention proposes an architecture in which the gantry support does not move along the first axial direction and the platform moves along the first axial direction. In the architecture, a width of a first axial direction of the circuit board detection device is increased, so that overall volume of the circuit board detection device is increased. In this way, for a user, space limitation on placement of the device is easily caused. Therefore, under the foregoing architecture of the present invention, a problem that the overall volume of the circuit board detection device needs to be overcome.

Therefore, the inventor of the present invention further proposes that the platform is controlled to be rotatable within a range of 0 degrees to 360 degrees. Relative positions of contacts of the circuit board and the gantry support are further adjusted, or an angle at which the contacts of the circuit board cannot be directly measured by a probe set may correspond to an angle at which a probe base can directly perform probing by controlling a rotation angle of the platform; and in conjunction with a movement of the platform along the first axial direction and displacement of the probe base on the gantry support along the second axial direction, to-be-measured contact connection traces of the circuit board can approach the gantry support by rotating the angle of the platform. Contacts in an area of the circuit board farthest from the gantry support in the second axial direction may be closest to the gantry support by controlling the platform to rotate by 360 degrees, so that moving stroke required for the platform along the first axial direction is shortened. Further, the overall volume of the circuit board detection device can be reduced, for example, a movement distance of the platform along the first axial direction is less than twice the width of the platform.

The proposed circuit board detection device includes a base, a stage assembly, a first gantry support, and at least one first probe assembly. The stage assembly is arranged on an upper surface of the base, and includes a platform, a rotary motor, and a linear drive module. The platform is arranged on the rotary motor, the rotary motor is arranged on the linear drive module, and the linear drive module is arranged on the upper surface of the base. The platform is configured to carry a circuit board and is capable of being driven by the linear drive module to move along a first axial direction, and the platform is further capable of being driven by the rotary motor to rotate within the range of 0 degrees to 360 degrees relative to a first rotation axis. The first rotation axis is perpendicular to the upper surface of the base and passes through a center of the platform. The platform has a width along the first axial direction, and a movement distance of the platform driven by the linear drive module along the first axial direction is less than twice the width of the platform. The first gantry support is fixed on the upper surface of the base and includes a first beam. The first beam extends along a second axial direction to span over the linear drive module, and includes a first probe guide rail. The second axial direction is parallel to the upper surface of the base and perpendicular to the first axial direction. The at least one first probe assembly is arranged on the first probe guide rail to be movable along the second axial direction through the first probe guide rail.

Preferably, the at least one first probe assembly includes a first mounting base and a first probe unit, the first mounting base is connected to the first probe guide rail, the first probe unit includes a first probe base and a first probe, the first probe base is rotatably arranged on the first mounting base, the first probe is arranged on the first probe base, the first probe base is rotatable within a range of 0 degrees to 180 degrees relative to a second rotation axis, and the second rotation axis is perpendicular to the upper surface of the base. The at least one first probe assembly includes an adaptation base arranged on the first probe base and at least one intermediate transmission line, two ends of the intermediate transmission line each include a first connector and a second connector, the first connector is electrically connected to the first probe, and the second connector is fixed to the adaptation base.

In this way, a transmission line is connected to a testing machine that provides a first probe test signal and the second connector respectively, a length of the intermediate transmission line is much shorter than a length of the transmission line, and the intermediate transmission line does not generate obvious shaking when the first probe moves along the second axial direction. Therefore, by spacing apart the first probe from the transmission line by using the intermediate transmission line, test data disturbance caused by shaking of the transmission line can be effectively reduced, and low stability of measurement results can be improved.

Preferably, the circuit board detection device further includes a testing machine and a transmission line. The testing machine is located above the first gantry support.

One end of the transmission line is connected to the testing machine, and the other end is connected to the at least one first probe assembly.

In this way, a weight of the testing machine is prevented from affecting a load of the gantry support, and increasing of shaking of the gantry support is avoided. In addition, the testing machine avoids disturbing testing stability of the testing machine due to an influence of the shaking of the gantry support, thereby improving low stability of measurement results.

Preferably, the circuit board detection device further includes a housing. The housing includes a top surface opening, where the base, the stage assembly, the first gantry support, and the at least one first probe assembly are arranged in the housing. The testing machine is arranged outside the housing, the housing is located above the first gantry support, one end of the transmission line is connected to the testing machine, and the other end penetrates into the housing through the top surface opening of the housing to be connected to the at least one first probe assembly.

In this way, the testing machine is arranged outside the housing, so that a weight of the testing machine is prevented from affecting a load of the gantry support, and increasing of shaking of the gantry support is avoided. In addition, the testing machine avoids disturbing testing stability of the testing machine due to an influence of the shaking of the gantry support, thereby improving low stability of measurement results.

Preferably, the linear drive module includes two first base plate guide rails, a first linear transmission mechanism, and a rotary motor base plate. The two first base plate guide rails extend along the first axial direction and are parallel to each other, where the first axial direction is parallel to the upper surface of the base. The first linear transmission mechanism is arranged between the two first base plate guide rails. The rotary motor base plate is arranged on the first linear transmission mechanism and the two first base plate guide rails and capable of being driven by the first linear transmission mechanism to move along the first axial direction, where the rotary motor base plate is parallel to the platform of the stage assembly, and the rotary motor of the stage assembly is arranged on the rotary motor base plate of the linear drive module.

In this way, the linear drive module drives the platform to move along the first axial direction, so that the platform and the first probe assembly on the gantry support can measure all contact connection traces on the circuit board.

Preferably, the linear drive module includes two first base plate guide rails, a first linear transmission mechanism, an intermediate base plate, two second base plate guide rails, a second linear transmission mechanism, and a rotary motor base plate. The two first base plate guide rails extend along the first axial direction and are parallel to each other, where the first axial direction is parallel to the upper surface of the base. The first linear transmission mechanism is arranged between the two first base plate guide rails. The intermediate base plate is arranged on the first linear transmission mechanism and the two first base plate guide rails and capable of being driven by the first linear transmission mechanism to move along the first axial direction. The two second base plate guide rails are arranged on the intermediate base plate, where the two second base plate guide rails extend along the second axial direction and are parallel to each other, and the second axial direction is parallel to the upper surface of the base. The second linear transmission mechanism is arranged on the intermediate base plate and located between the two second base plate guide rails. The rotary motor base plate is arranged on the second linear transmission mechanism and the two second base plate guide rails and capable of being driven by the second linear transmission mechanism to move along the second axial direction, where the rotary motor base plate is parallel to the platform of the stage assembly, and the rotary motor of the stage assembly is arranged on the rotary motor base plate of the linear drive module.

In this way, the linear drive module drives the platform to move along the first axial direction and the second axial direction, so that the platform and the first probe assembly on the gantry support can measure all contact connection traces on the circuit board, and movement of the first probe assembly on the first gantry support along the second axial direction can be further reduced, thereby improving test data disturbance caused by shaking of the transmission line connected between the testing machine and the first probe assembly. In addition, the first gantry support includes a first beam. In an architecture in which the linear drive module does not provide movement along the second axial direction, probing stroke of the first probe assembly is required to cover contacts of the to-be-tested circuit board, and a length of the first beam along the second axial direction is about thrice a length of the platform along the second axial direction. In an architecture in which the linear drive module provides the movement along the second axial direction, the platform moves along the second axial direction, so that the probing stroke of the first probe assembly is reduced. Further, the overall volume of the circuit board detection device can be reduced, for example, the length of the first beam along the second axial direction is less than thrice the length of the platform along the second axial direction.

Preferably, the linear drive module includes two first base plate guide rails, a first linear transmission mechanism, an intermediate base plate, two second base plate guide rails, a second linear transmission mechanism, and a rotary motor base plate. The two first base plate guide rails extend along the second axial direction and are parallel to each other, where the second axial direction is parallel to the upper surface of the base. The first linear transmission mechanism is arranged between the two first base plate guide rails. The intermediate base plate is arranged on the first linear transmission mechanism and the two first base plate guide rails and capable of being driven by the first linear transmission mechanism to move along the second axial direction. The two second base plate guide rails are arranged on the intermediate base plate, where the two second base plate guide rails extend along the first axial direction and are parallel to each other, and the first axial direction is parallel to the upper surface of the base. The second linear transmission mechanism is arranged on the intermediate base plate and located between the two second base plate guide rails. The rotary motor base plate is arranged on the second linear transmission mechanism and the two second base plate guide rails and capable of being driven by the second linear transmission mechanism to move along the first axial direction, where the rotary motor base plate is parallel to the platform of the stage assembly, and the rotary motor of the stage assembly is arranged on the rotary motor base plate of the linear drive module.

In this way, the linear drive module drives the platform to move along the first axial direction and the second axial direction, so that the platform and the first probe assembly on the gantry support can measure all contact connection traces on the circuit board, and movement of the first probe assembly on the first gantry support along the second axial direction can be further reduced, thereby improving test data disturbance caused by shaking of the transmission line connected between the testing machine and the first probe assembly. In addition, the first gantry support includes a first beam. In an architecture in which the linear drive module does not provide movement along the second axial direction, probing stroke of the first probe assembly is required to cover contacts of the to-be-tested circuit board, and a length of the first beam along the second axial direction is about thrice a length of the platform along the second axial direction. In an architecture in which the linear drive module provides the movement along the second axial direction, the platform moves along the second axial direction, so that the probing stroke of the first probe assembly is reduced. Further, the overall volume of the circuit board detection device can be reduced, for example, the length of the first beam along the second axial direction is less than thrice the length of the platform along the second axial direction.

Preferably, the stage assembly further includes a bottom plate and two side plates. The bottom plate is arranged on an upper surface of the platform, and includes two side edges parallel to each other. The two side plates are opposite to each other and arranged upright on the two side edges of the bottom plate, where clamping members for clamping the circuit board are arranged on surfaces of the two side plates that are opposite to each other, the clamping member of each side plate has a same height relative to an upper surface of the bottom plate along a third axial direction, and the third axial direction is perpendicular to the upper surface of the bottom plate.

In this way, the clamping members can suspend the circuit board at a specific height from an upper surface of the bottom plate, so that the first probe assembly is closer to the circuit board, thereby improving a problem that a transmission line connected between the testing machine and the first probe assembly swings too much.

Preferably, the circuit board detection device further includes a testing machine and at least one transmission line. The testing machine is fixed on a first beam of the first gantry support. One end of the at least one transmission line is connected to the testing machine, and the other end is connected to the at least one first probe assembly.

In this way, in anticipation of miniaturization of the testing machine, a weight of the testing machine does not affect a load of the gantry support, and increasing of shaking of the gantry support is avoided, thereby improving low stability of measurement results.

Preferably, the circuit board detection device further includes two gantry guide rails, a second gantry support, and at least one second probe assembly. The two gantry guide rails are arranged parallel to each other on the upper surface of the base and extend along the first axial direction. The second gantry support is arranged on the two gantry guide rails and spaced apart from the first gantry support along the first axial direction, where the second gantry support includes a second beam extending along the second axial direction, the second beam includes a second probe guide rail, and the second gantry support moves along the first axial direction through the two gantry guide rails and maximum displacement along the first axial direction is less than half the width of the platform. The at least one second probe assembly is connected to the second probe guide rail to be movable along the second axial direction through the second probe guide rail, where the at least one second probe assembly includes a second mounting base and a second probe unit, the second mounting base is connected to the second probe guide rail, the second probe unit includes a second probe base and a second probe, the second probe base is rotatably arranged on the second mounting base, the second probe is arranged on the second probe base, the second probe base is rotatable within a range of 0 degrees to 180 degrees relative to a third rotation axis, and the third rotation axis is perpendicular to the upper surface of the base.

In this way, the second gantry support is used together with the fixed first gantry support, and a movement range required by the second gantry support is very small. Therefore, when the second gantry support reaches a predetermined position, time required from shaking to rest can be controlled within acceptable time, to further improve testing capacity.

Preferably, a shape of the platform is selected from a square, a rectangle, or a circle; when the shape of the platform is the square, the width of the platform is a length of any edge of the platform; when the shape of the platform is the rectangle, the width of the platform is a length of a longer edge of the platform; and when the shape of the platform is the circle, the width of the platform is a diameter of the platform.

DETAILED DESCRIPTION

Figure 1:
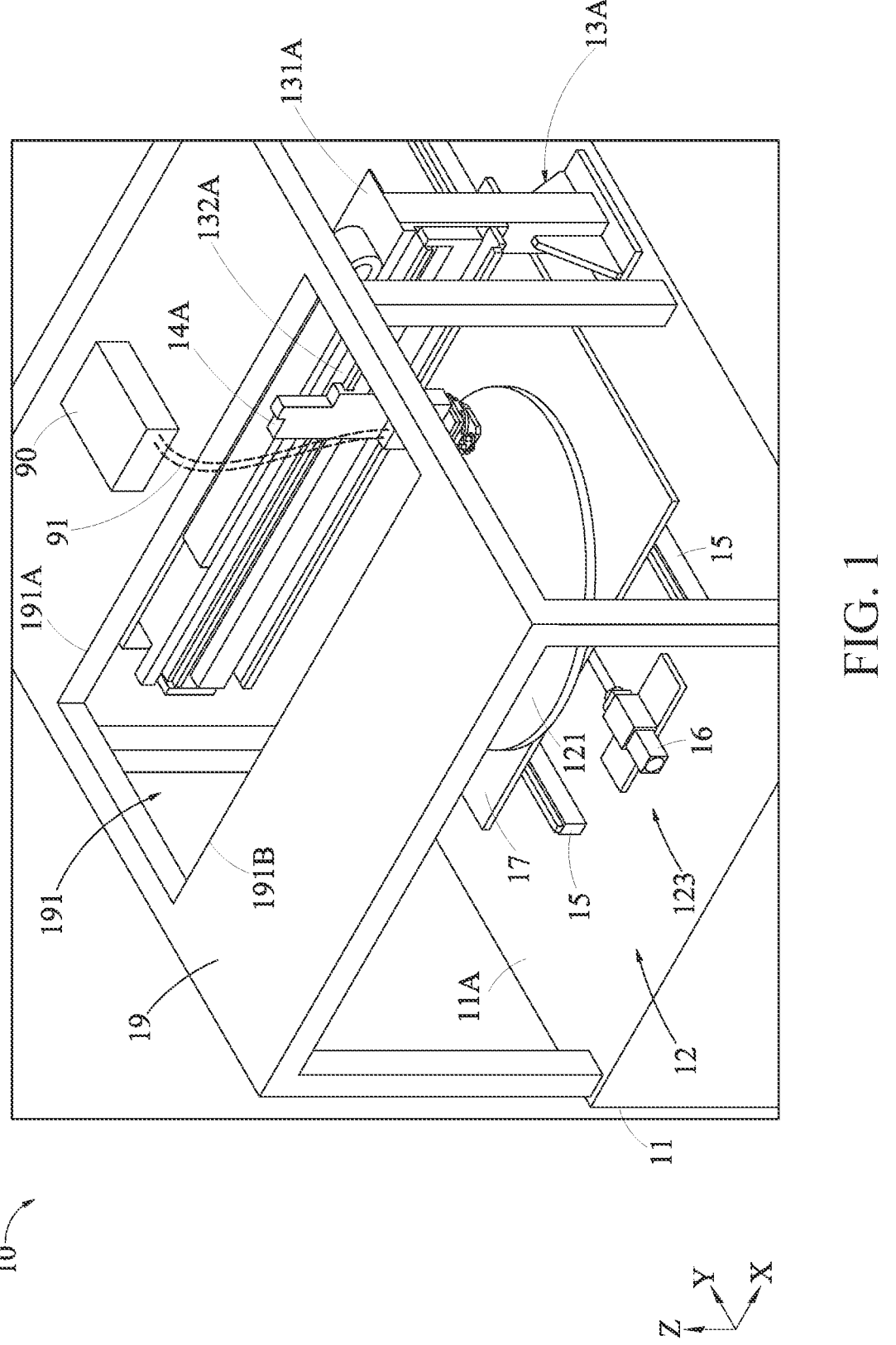
FIG. 1 is a three-dimensional diagram of a circuit board detection device according to an example of the present invention.
Figure 2:
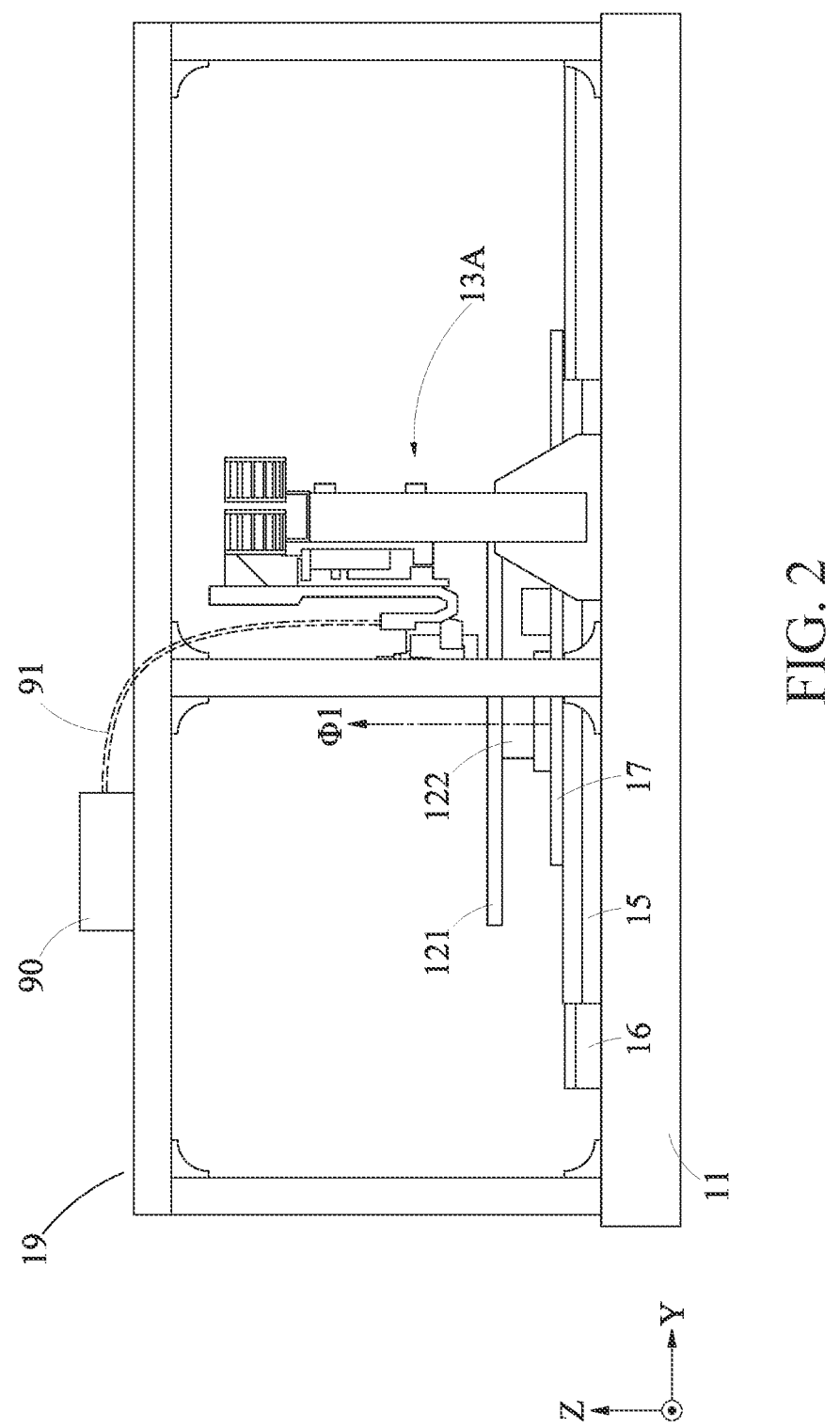
FIG. 2 is a side view of a circuit board detection device according to an example of the present invention.
Figure 3:
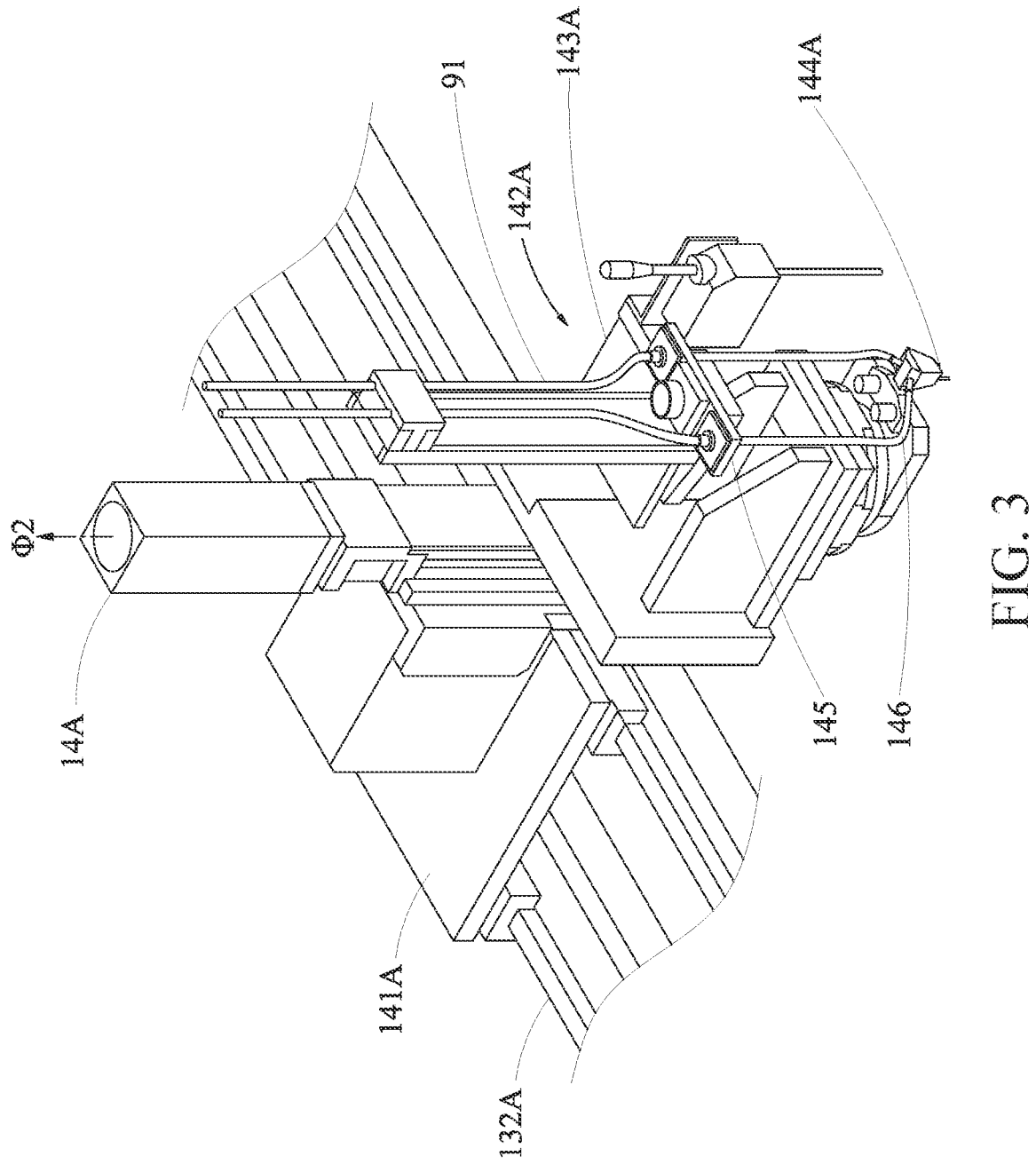
FIG. 3 is a schematic diagram of a first probe assembly of a circuit board detection device according to an example of the present invention.

FIG. 1 to FIG. 3 are respectively a three-dimensional diagram and a side view of a circuit board detection device 10 and a schematic diagram of a first probe assembly 14A according to an example of the present invention. The shown circuit board detection device 10 is configured to perform electrical detection on a circuit board, and can effectively resolve a problem of a traditional circuit board detection device. In addition, a Cassovian coordinate axis is also marked in the figures, to facilitate understanding of relative relationships and displacement relationships of various components of the circuit board detection device 10 in space.

The circuit board detection device 10 includes a base 11, a stage assembly 12, a first gantry support 13A, and the first probe assembly 14A. In addition, a Cassovian coordinate axis is also marked in the figures, to facilitate understanding of relative relationships of various components in this embodiment in space.

The stage assembly 12 in this embodiment is arranged on an upper surface 11A of the base 11, and mainly includes a platform 121, a rotary motor 122, and a linear drive module 123. The linear drive module 123 is arranged on the upper surface 11A of the base 11. The linear drive module 123 includes two first base plate guide rails 15 extending along a first axial direction (a Y-axis direction in the figures) and parallel to each other, a first linear transmission mechanism 16 arranged between the two first base plate guide rails 15, and a rotary motor base plate 17 arranged on the first linear transmission mechanism 16 and the two first base plate guide rails 15 and capable of being driven by the first linear transmission mechanism 16 to move along the Y-axis direction. The rotary motor base plate 17 is parallel to the platform 121, and the platform 121 is located on the rotary motor base plate 17. The rotary motor 122 is arranged on the rotary motor base plate 17, and is rotatable within a range of 0 degrees to 360 degrees relative to a first rotation axis Φ1. The rotary motor 122 is arranged between the platform 121 and the rotary motor base plate 17. The bottom of the rotary motor base plate 17 is provided with a gear (not shown in the figures) that meshes with the first linear transmission mechanism 16. When the first linear transmission mechanism 16 rotates, the rotary motor 122 can be driven to linearly move along the Y-axis direction. The platform 121 is arranged on the rotary motor 122, and is configured to carry the to-be-tested circuit board. The platform 121 can be driven by the rotary motor 122 to rotate within the range of 0 degrees to 360 degrees relative to the first rotation axis Φ1. Together with the rotary motor 122, the platform 121 can be driven by the linear drive module 123 to linearly move along the Y-axis direction. As shown in FIG. 2, the first rotation axis Φ1 is parallel to a Z-axis in the figure and perpendicular to the upper surface 11A of the base 11, and the first rotation axis Φ1 passes through a geometric center of the platform 121. In some embodiments, the linear transmission mechanism could be but not limited to a ball screw transmission mechanism, a belt transmission mechanism, or a linear motor.

A shape of the platform 121 in the figure is a circle, and a width of the platform 121 along the Y-axis direction is equivalent to a diameter of the platform 121. In some embodiments, when the platform 121 is driven by the linear drive module 123 to move along the Y-axis direction, a movement distance of the platform 121 is less than twice the width (diameter) of the platform 121. In other words, a maximum movement distance of the platform 121 may be 1.5 times, once, or 0.5 times the width of the platform 121 along the Y-axis direction.

The first gantry support 13A is fixed on the upper surface 11A of the base 11, and includes a first beam 131A extending along a second axial direction (an X-axis direction in the figures) to span over the linear drive module 123. The first beam 131A includes at least one first probe guide rail 132A and at least one first probe assembly 14A, where the first probe assembly 14A is connected to the first probe guide rail 132A to be limited by the first probe guide rail 132A to move along the X-axis direction. The X-axis direction is perpendicular to the Y-axis direction in the figures, and both the X-axis direction and the Y-axis direction are parallel to the upper surface 11A of the base 11.

One feature of the circuit board detection device 10 in this embodiment is that the first gantry support 13A is directly fixed on the upper surface 11A of the base 11. Therefore, one effect of this embodiment compared to that of the prior art is that the first gantry support 13A does not shake during probing to cause test data disturbance. In addition, the inventor also discovered that in addition to that the shaking of the gantry support causes test data disturbance, shaking of a transmission line 91 can also cause test data disturbance. The shaking of the transmission line 91 is caused because two ends of the transmission line 91 each are fixed on a testing machine 90 and the first probe assembly 14A and a line body of the transmission line 91 is not fixed. Therefore, when a gantry support of a traditional circuit board detection device moves, the transmission line 91 is pulled. When the gantry support moves to a predetermined position and stops, the line body of the transmission line 91 shakes due to inertia. Because the first gantry support 13A of the circuit board detection device 10 in this embodiment does not move, test data disturbance caused by the shaking of the transmission line 91 is also greatly reduced.

Refer to FIG. 3. In some embodiments, the first probe assembly 14A includes a first mounting base 141A and a first probe unit 142A, where the first mounting base 141A is connected to the first probe guide rail 132A. The first probe unit 142A includes a first probe base 143A and a first probe 144A, and the first probe base 143A is rotatably arranged on the first mounting base 141A. The first probe 144A is arranged on the first probe base 143A, where the first probe base 143A is rotatable within a range of 0 degrees to 180 degrees relative to a second rotation axis $\Phi 2$, and the second rotation axis $\Phi 2$ is perpendicular to the upper surface 11A of the base 11. By allowing the first probe base 143A to have a degree of freedom to rotate relative to the second rotation axis $\Phi 2$, the circuit board detection device 10 in this embodiment can be more suitable for a situation in which distribution of to-be-tested contacts is relatively special.

Figure 4:
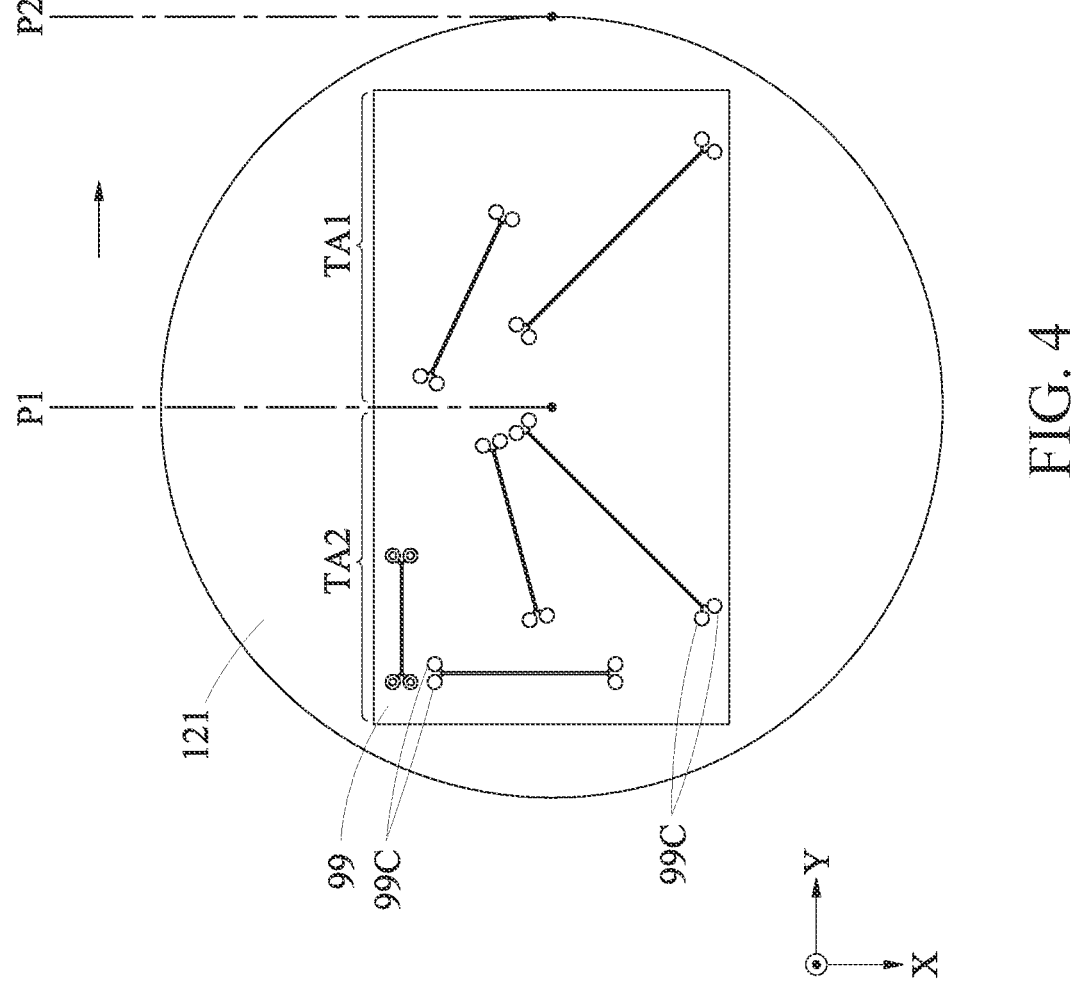
FIG. 4 is a schematic test diagram (1) of a circuit board detection device according to an example of the present invention.
Figure 5:
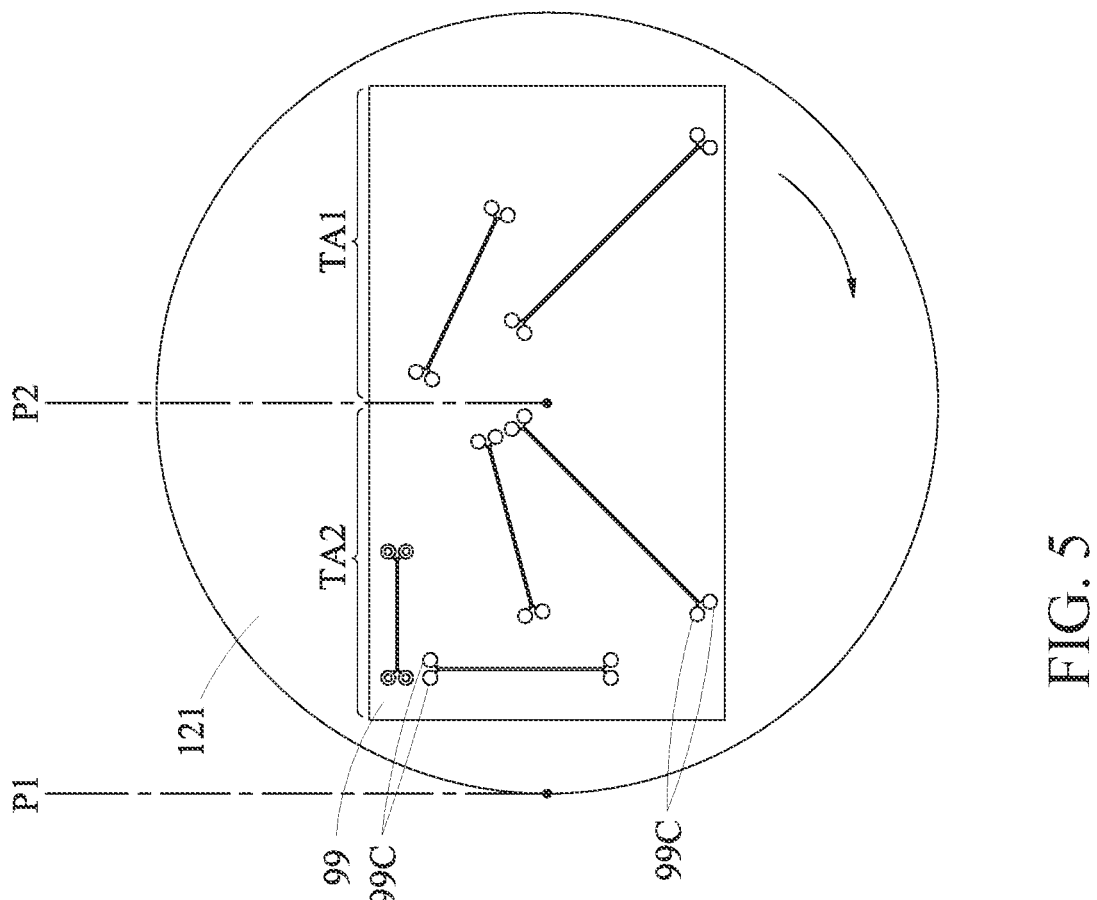
FIG. 5 is a schematic test diagram (2) of a circuit board detection device according to an example of the present invention.
Figure 5:
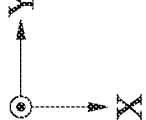
Figure 6:
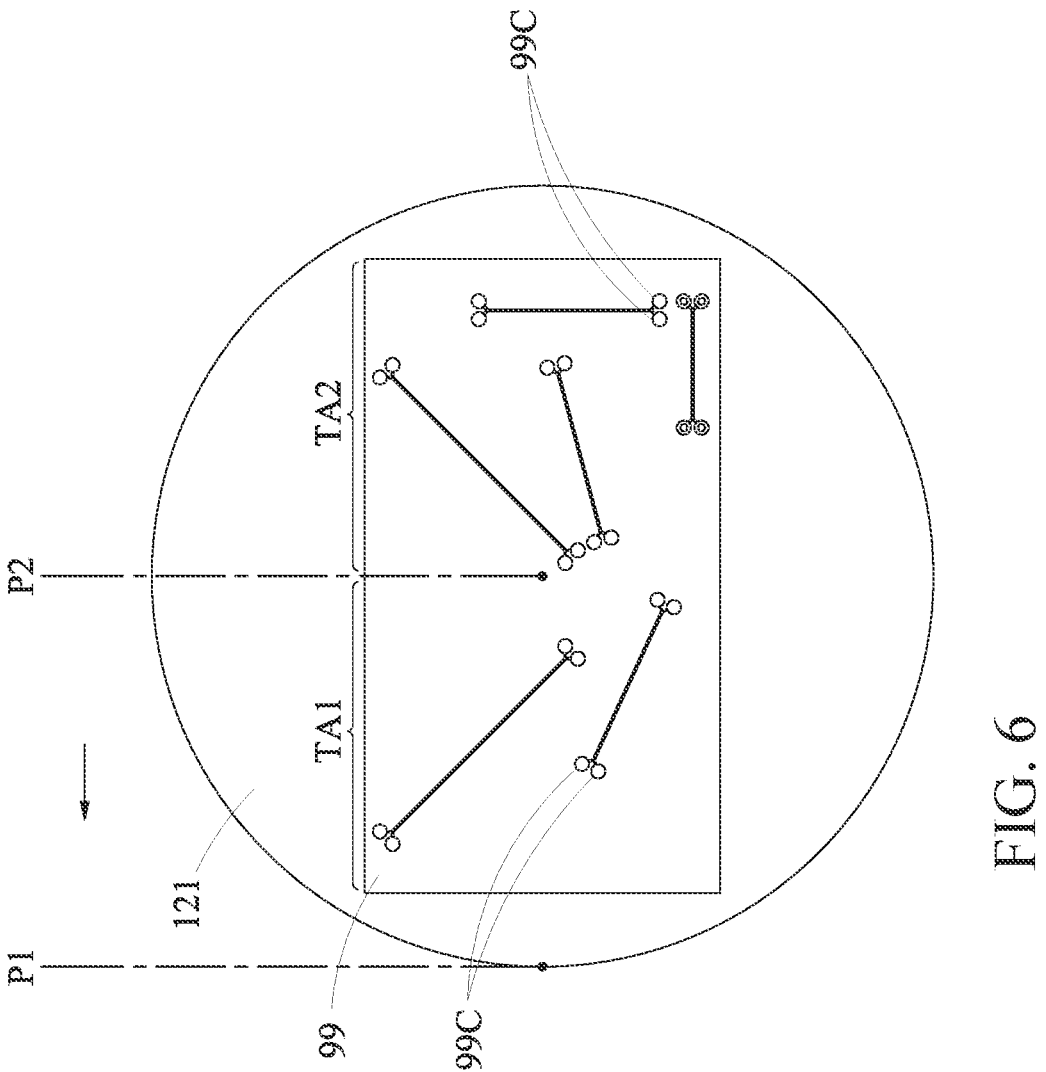
FIG. 6 is a schematic test diagram (3) of a circuit board detection device according to an example of the present invention.
Figure 7:
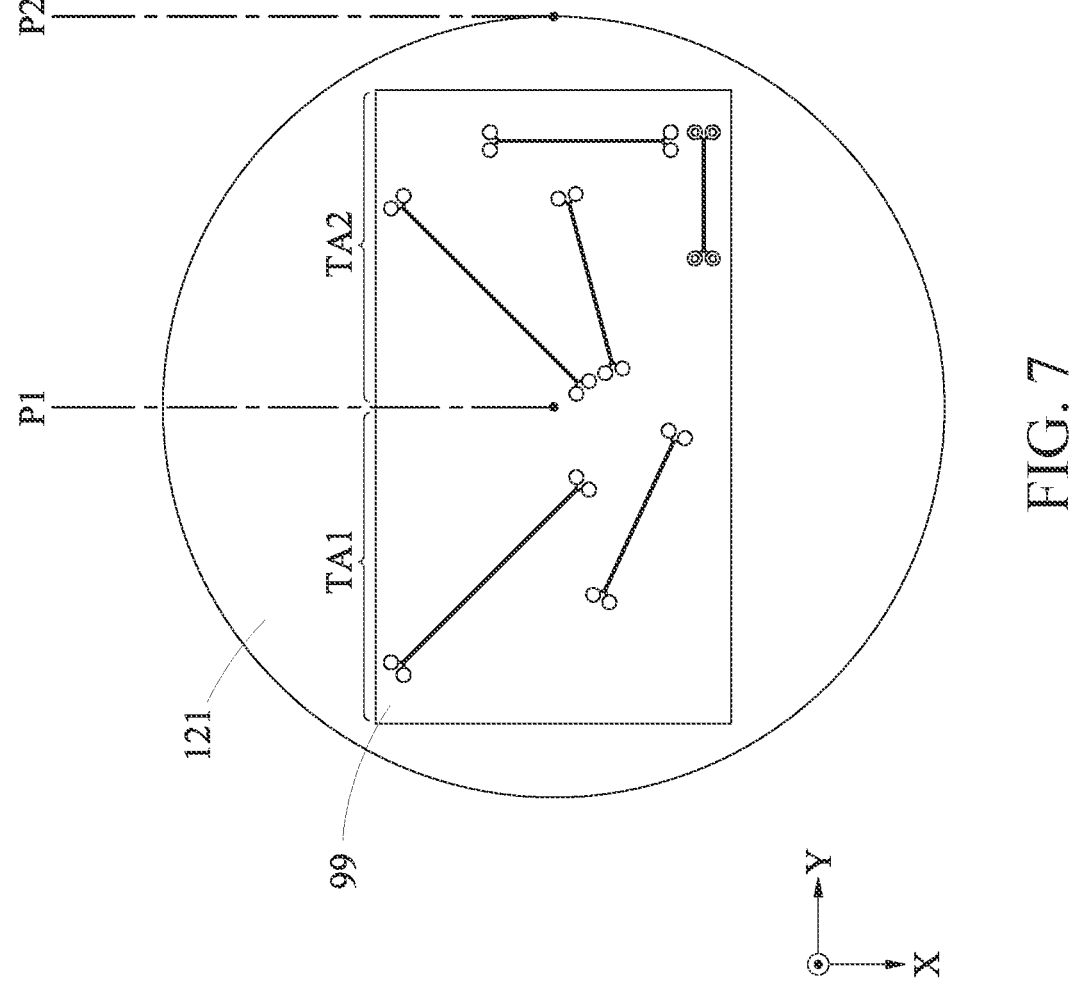
FIG. 7 is a schematic test diagram (4) of a circuit board detection device according to an example of the present invention.

To further illustrate advantages of the rotatable platform 121, FIG. 4 to FIG. 7 are schematic rotation diagrams (1) to (4) of the platform of the circuit board detection device 10 according to an example of the present invention. As shown in FIG. 4, a circuit board 99 arranged on the platform 121 includes a plurality of to-be-tested points 99C, and the circuit board 99 may be divided into a test area TA1 and a test area TA2 that have a same footprint. It is assumed that before starting to perform probing, the geometric center of the platform 121 is located at a position P1 in the figure, and the first probe assembly 14A arranged on the first gantry support 13A is located at a position P2 in the figure. When starting to perform probing, the platform 121 and the circuit board 99 on the platform 121 are driven by the linear drive module 123 to move along the Y-axis direction to a right side of the figure, and the first probe assembly 14A moves along the X-axis direction to the above of the to-be-tested points 99C to perform probing on the to-be-tested points 99C. Further, the first probe assembly 14A performs probing on the to-be-tested points 99C, and the testing machine 90 provides a time domain test signal, to further measure electrical characteristics of traces connected to the to-be-tested points 99C. If there are two first probe assemblies 14A, to-be-tested points 99C on two ends of a same trace may be respectively targeted, and the testing machine 90 provides a frequency domain test signal, to further measure an electrical characteristic of the trace. As shown in FIG. 5, when all to-be-tested points 99C in the test area TA1 have been completely tested, the platform 121 has moved along the Y-axis direction by a distance equivalent to a radius of the platform 121. In this case, the rotary motor 122 can be controlled to drive the platform 121 to rotate by 180 degrees. As shown in FIG. 6, after the platform 121 rotates by 180 degrees, the test area TA2 of the circuit board 99 replaces a position of the original test area TA1. In this case, all to-be-tested points 99C in the test area TA2 can be probed by the first probe assembly 14A as long as the linear drive module 123 drives the platform 121 to move along the Y-axis direction to a left side of the figure. In other words, in this embodiment, by increasing a degree of freedom that the platform 121 may rotate relative to the first rotation axis $\Phi 1$, a maximum distance required by the platform 121 to move along the Y-axis direction during testing can be reduced. For example, maximum stroke of the linear drive module 123 only needs to be able to drive half of the circuit board 99 through the bottom of the first gantry support 13A. Subsequently, the platform 121 only needs to rotate by 180 degrees, so that the other half of the circuit board 99 can be probed by the first probe assembly 14A through the bottom of the first gantry support 13A. In this way, an overall machine footprint of the circuit board detection device 10 can be reduced, which helps achieve a more compact production line machine configuration.

Refer to FIG. 3 again. In some embodiments, the first probe assembly 14A includes an adaptation base 145 arranged on the first probe base 143A and at least one intermediate transmission line 146. The adaptation base 145 is configured to be connected to the transmission line 91 to receive the test signal of the testing machine 90. One end of the intermediate transmission line 146 is electrically connected to the first probe 144A, and the other end of the intermediate transmission line 146 is fixed on the adaptation base 145 to receive the test signal of the testing machine 90 through the adaptation base 145. A length of the intermediate transmission line 146 is much shorter than a length of the transmission line 91 (for example, is only ½0 to ⅟15 of the length of the transmission line 91), and the intermediate transmission line 146 does not generate obvious shaking when the first probe unit 142A moves along the X-axis direction. Therefore, by spacing apart the first probe 144A from the transmission line 91 by using the intermediate transmission line 146, test data disturbance caused by shaking of the transmission line 91 can be effectively reduced.

Figure 10:
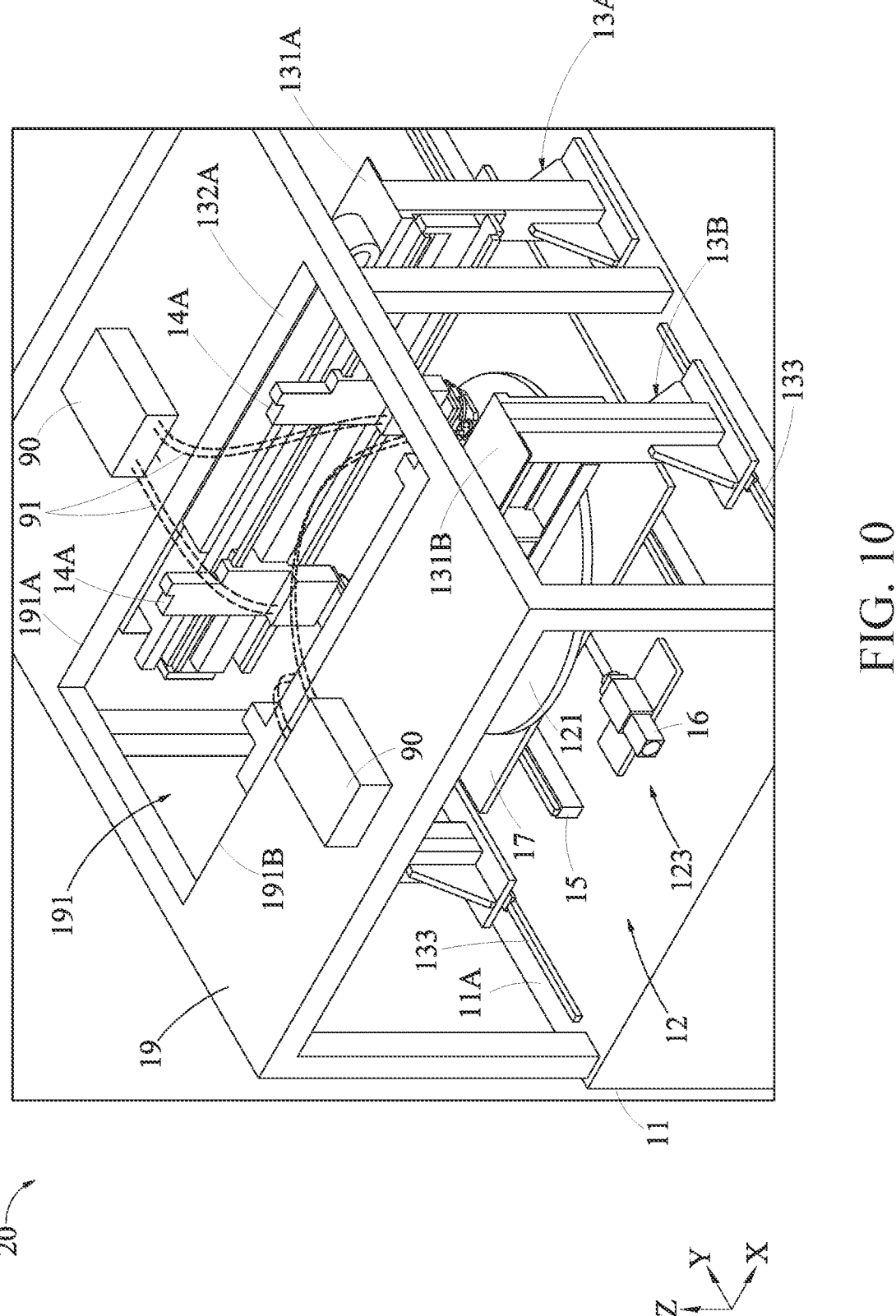
FIG. 10 is a three-dimensional diagram of a circuit board detection device according to another example of the present invention.

Refer to FIG. 1 and FIG. 2 again. In some embodiments, the circuit board detection device 10 further includes a testing machine 90 configured to generate a test signal and a transmission line 91 for transmitting the test signal. The testing machine 90 is located above the first gantry support 13A. One end of the transmission line 91 is connected to the testing machine 90, and the other end is connected to the at least one first probe assembly 14A. As shown in FIG. 10, in some embodiments, to improve probing efficiency, the circuit board detection device 10 may include two first probe assemblies 14A and two transmission lines 91. The testing machine 90 transmits the test signal to the two first probe assemblies 14A respectively through the transmission lines 91. In addition, in some embodiments, when frequency testing is performed on the circuit board 99, at least one input signal and at least one output signal are required. In this way, the circuit board detection device 10 needs two first probe assemblies 14A and two transmission lines 91, to provide one first probe assembly 14A to transmit a test signal of the circuit board detection device 10 to the to-be-tested circuit board 99, and use the other first probe assembly 14A to transmit a signal generated by the to-be-tested circuit board 99 back to the circuit board detection device 10 for analysis.

Refer to FIG. 1 and FIG. 2 again. In some embodiments, the circuit board detection device 10 further includes a housing 19. The housing 19 includes a top surface opening 191, where the base 11, the stage assembly 12, the first gantry support 13A, and the first probe assembly 14A are arranged in the housing 19. The testing machine 90 is arranged outside the housing 19, and the housing 19 is located above the first gantry support 13A. One end of the transmission line 91 is connected to the testing machine 90, and the other end penetrates into the housing 19 through the top surface opening 191 of the housing 19 to be connected to the first probe assembly 14A.

Figure 8:
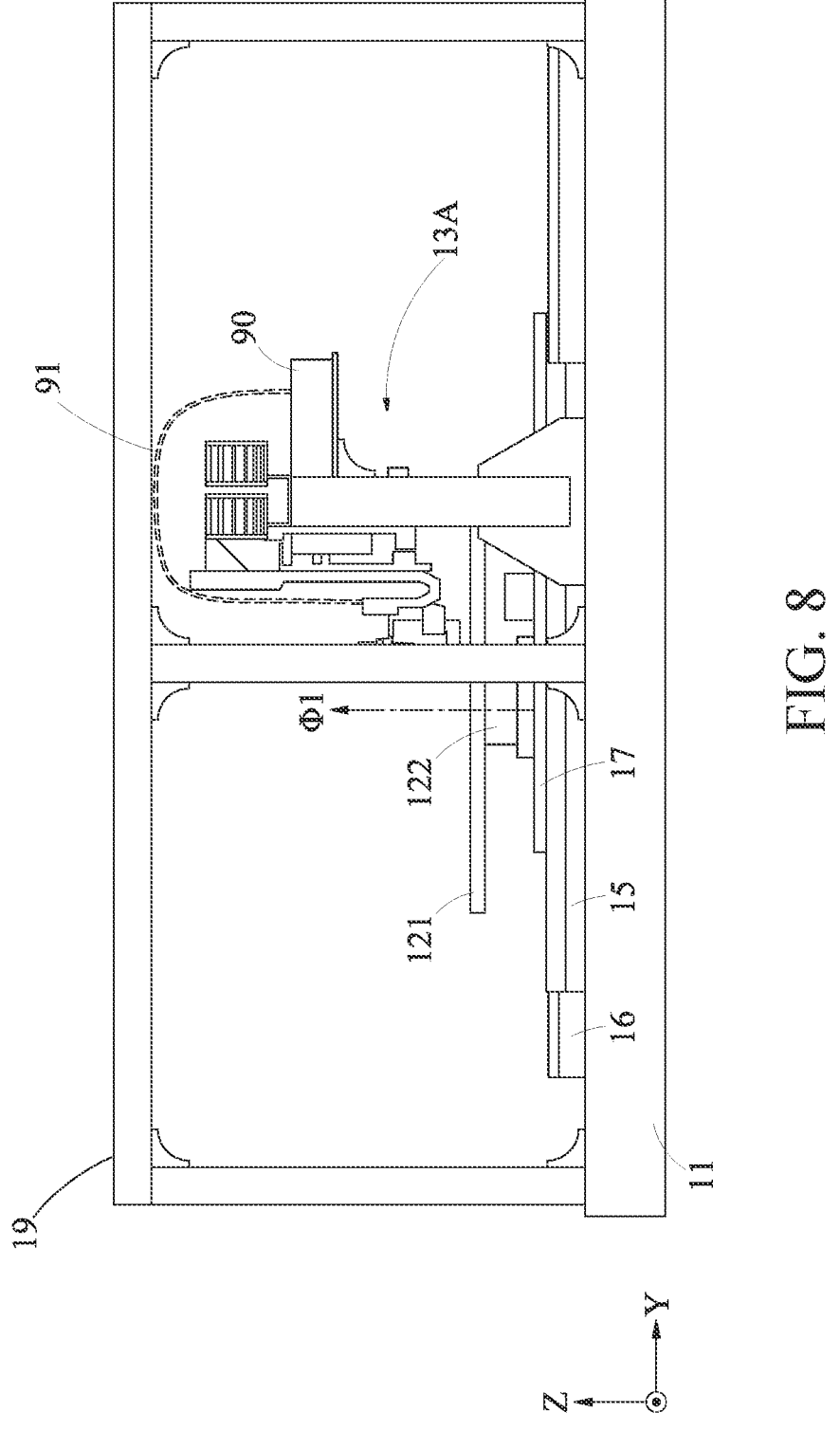
FIG. 8 is a schematic diagram of a testing machine arranged on a first gantry support.

In some embodiments, as shown in FIG. 8, the testing machine 90 is fixed on the first gantry support 13A, and in particular, fixed on a first beam 131A of the first gantry support 13A. Similarly, one end of the transmission line 91 is connected to the testing machine 90, and the other end is connected to the first probe assembly 14A. For a traditional circuit board detection device, because the testing machine 90 has a certain weight, if the testing machine 90 is arranged on a movable gantry support, a load on a transmission mechanism configured to move the gantry support is increased. In addition, shaking of the gantry support is more serious because of increased inertia. To avoid increasing the shaking of the gantry support, in one solution, the testing machine 90 is arranged above the first gantry support 13A. Preferably, the testing machine 90 is arranged on the housing 19, to prevent an excessive weight of the testing machine 90 from causing serious shaking of the first gantry support 13A.

Refer to FIG. 1 again. In some embodiments, the top surface opening 191 includes an edge 191A and an edge 191B that extend along the X-axis direction, the first gantry support 13A is located right below the edge 191A of the top surface opening 191, and the testing machine 90 is preferably arranged on a side of a top surface of the housing 19 adjacent to the edge 191A of the top surface opening 191. If the testing machine 90 is arranged on a side of the top surface of the housing 19 adjacent to the edge 191B of the top surface opening 191, a total length required by the transmission line 91 is longer, and in addition, when the first probe assembly 14A moves along the X-axis, the transmission line 91 swings too much.

Figure 9:
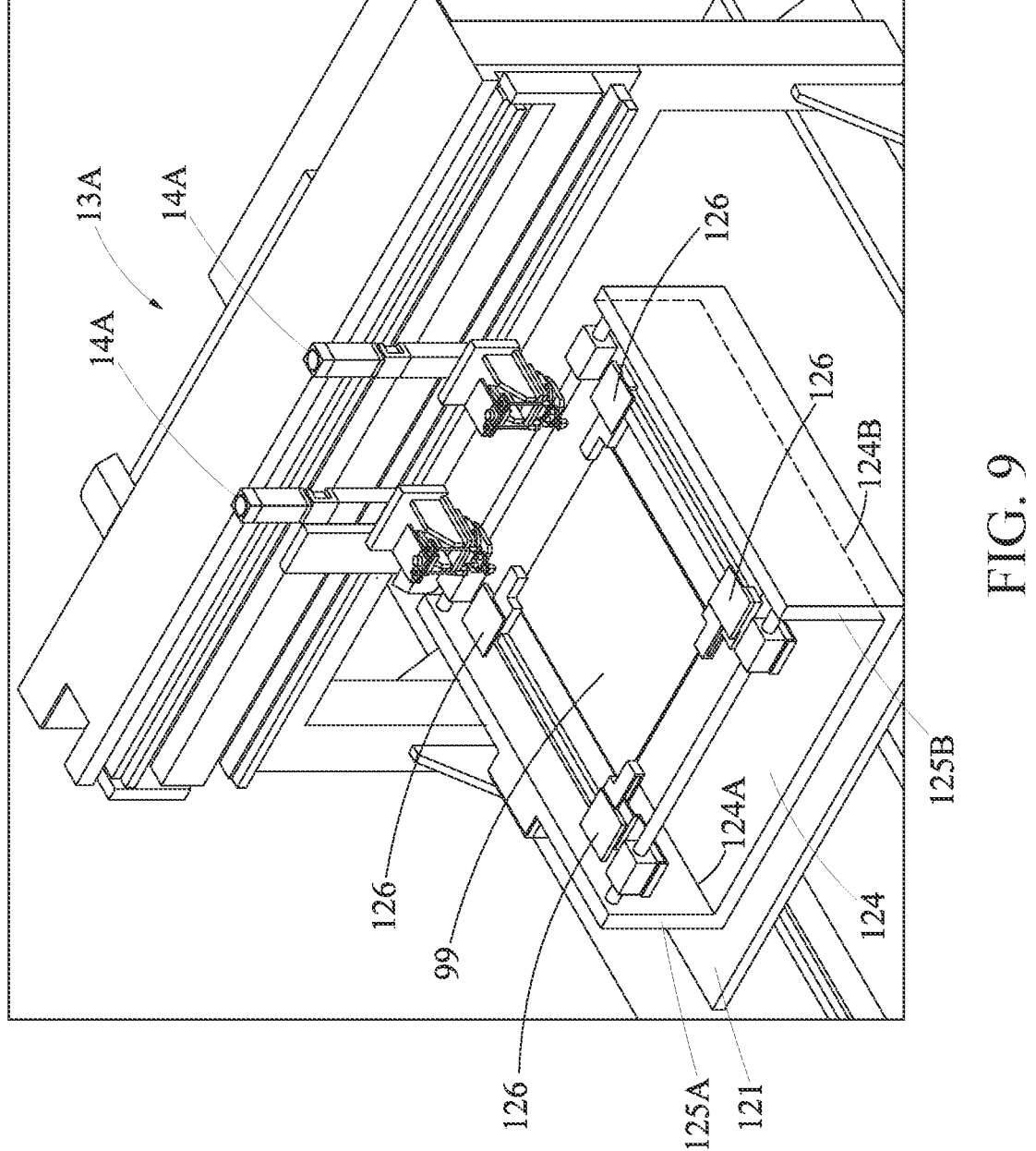
FIG. 9 is a schematic diagram of suspending a circuit board.

Refer to FIG. 9. In some embodiments, the stage assembly 12 further includes a bottom plate 124 and two side plates 125A and 125B. The bottom plate 124 is arranged on an upper surface of the platform 121, and includes two side edges 124A and 124B parallel to each other. The side plate 125A and the side plate 125B are opposite to each other and arranged upright on the side edge 124A and the side edge 124B of the bottom plate 124. Clamping members 126 (where two clamping members are shown in the figure) configured to clamp the circuit board 99 are arranged on a surface of the side plate 125A toward the side plate 125B, clamping members 126 (where two clamping members are shown in the figure) configured to clamp the circuit board 99 are arranged on a surface of the side plate 125B toward the side plate 125A, and the clamping members 126 have a same height relative to an upper surface of the bottom plate 124 along a Z-axis direction. In this way, the clamping members 126 can suspend the circuit board 99 at a specific height from the upper surface of the bottom plate 124. A design of the clamping members 126 can make the first probe assembly 14A closer to the circuit board 99 (compared with the architecture in the embodiment of FIG. 1 and FIG. 2), so that a problem that the transmission line 91 swings two much can be reduced.

FIG. 10 is a three-dimensional diagram of a circuit board detection device 20 according to another example of the present invention. To improve a detection speed, compared with the circuit board detection device 10, a movable second gantry support 13B is added in the circuit board detection device 20, and a second probe assembly is arranged on the second gantry support 13B. The second gantry support 13B is arranged on two gantry guide rails 133 parallel to each other, and the two gantry guide rails 133 are arranged on an upper surface 11A of a base 11 and extend along a Y-axis direction. The second gantry support 13B is spaced apart from the first gantry support 13A along the Y-axis direction, and includes a second beam 131B extending along an X-axis direction. The second gantry support 13B is movable along the Y-axis direction through the two gantry guide rails 133 and maximum displacement along the Y-axis direction is less than half a width of a platform 121 along the Y-axis direction. The second beam 131B includes a second probe guide rail with a same structure as the first probe guide rail 132A, and the second probe assembly is connected to the second probe guide rail to move along the X-axis direction through the second probe guide rail. A structure of the second probe assembly is the same as that of the first probe assembly 14A. Details are not described again.

If the gantry support described above is movable, shaking (including shaking of the gantry support and shaking of a transmission line) caused by movement of the gantry support causes test data disturbance. However, the second gantry support 13B in this embodiment is used together with the fixed first gantry support 13A, and during actual probing, a movement range required by the second gantry support 13B is very small. Therefore, when the second gantry support 13B reaches a predetermined position, time required from shaking to rest can be controlled within acceptable time.

In addition to adding the second gantry support 13B, two first probe assemblies 14A may also be arranged on the first gantry support 13A to improve detection efficiency. As shown in FIG. 10, the two first probe assemblies 14A may be respectively limited by different first probe guide rails 132A to independently move along the X-axis direction, and a testing machine 90 may transmit a test signal to the two first probe assemblies 14A respectively through two transmission lines 91, so that more than two to-be-tested devices (DUT) are simultaneously probed.

In some embodiments, a shape of the platform 121 is a square or a rectangle. When the platform 121 is driven by a linear drive module 123 to move along the Y-axis direction, a movement distance of the platform 121 is less than twice the width of the platform 121 along the Y-axis direction. For example, a maximum movement distance of the platform 121 is equal to the width of the platform 121 along the Y-axis direction, or equal to ½ of the width of the platform 121 along the Y-axis direction.

Figure 11:
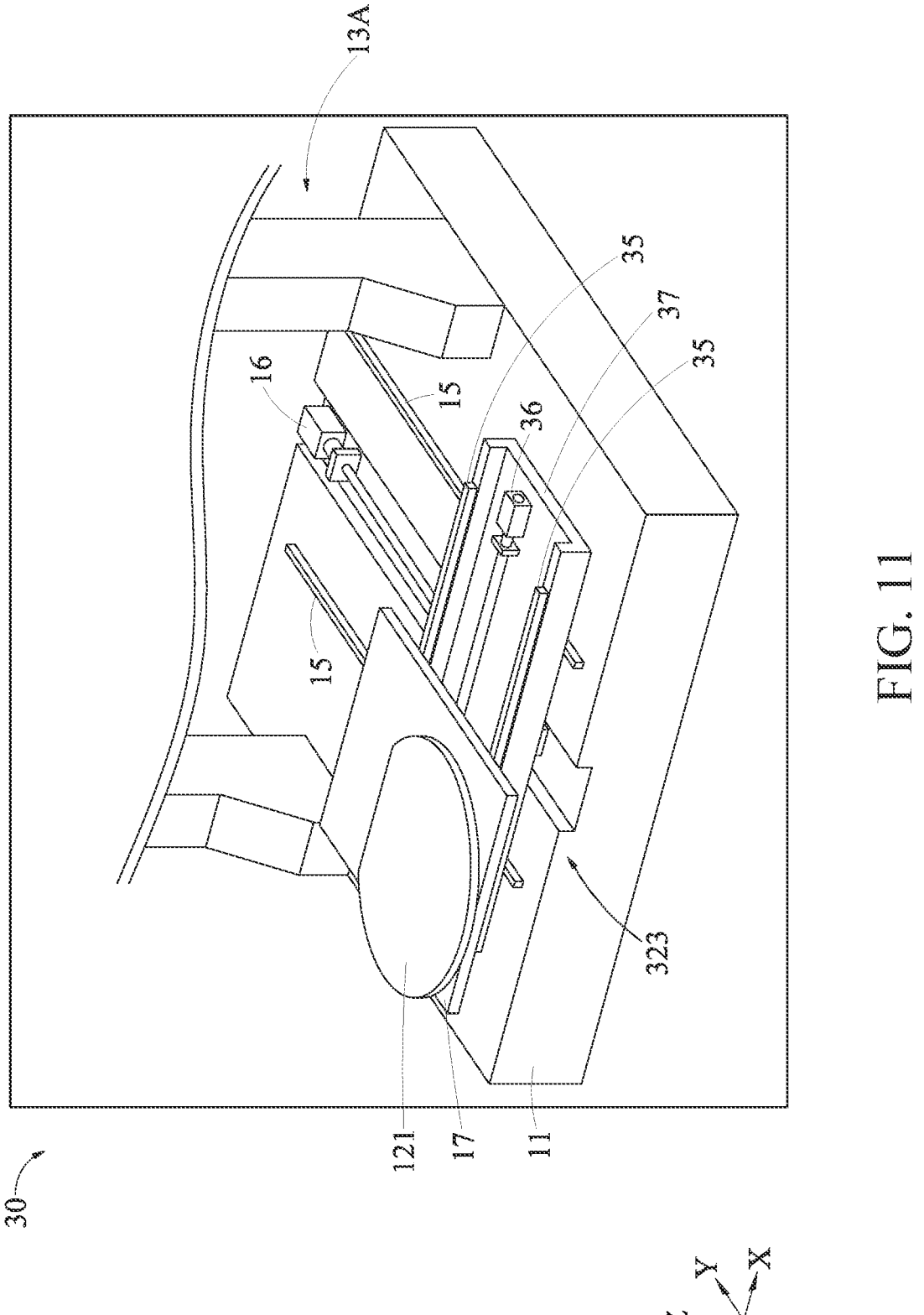
FIG. 11 is a three-dimensional diagram of a circuit board detection device according to still another example of the present invention.

FIG. 11 is a three-dimensional diagram of a circuit board detection device 30 according to another example. A main difference between the circuit board detection device 30 and the circuit board detection device 10 is that designs of linear drive modules are different. A linear drive module 323 of the circuit board detection device 30 is arranged on an upper surface of a base 11. The linear drive module 323 includes two first base plate guide rails 15, extending along a first axial direction (a Y-axis direction in the figure) and parallel to each other; a first linear transmission mechanism 16, arranged between the two first base plate guide rails 15; an intermediate base plate 37, arranged on the first linear transmission mechanism 16 and the two first base plate guide rails 15 and capable of being driven by the first linear transmission mechanism 16 to move along the Y-axis direction; two second base plate guide rails 35, arranged on the intermediate base plate 37, extending along a second axial direction (an X-axis direction in the figure), and parallel to each other; a second linear transmission mechanism 36, arranged on the intermediate base plate 37 and located between the two second base plate guide rails 35; and a rotary motor base plate 17, arranged on the second linear transmission mechanism 36 and the two second base plate guide rails 35 and capable of being driven by the second linear transmission mechanism 36 to move along the X-axis direction, where the rotary motor base plate 17 is parallel to a platform 121, and a rotary motor 122 of a stage assembly 12 is arranged on the rotary motor base plate 17. Compared with that a linear drive module 123 of the circuit board detection device 10 can only drive the platform 121 to move along the Y-axis direction, the linear drive module 323 of the circuit board detection device 30 can drive the rotary motor base plate 121 along both the Y-axis direction and the X-axis direction. Therefore, a movement amount of a first probe assembly 14A on a first gantry support 13A along the X-axis direction can be greatly reduced, thereby improving test data disturbance caused by shaking of a transmission line 91.

In some embodiments, the two first base plate guide rails 15 of the circuit board detection device 30 extend along the X-axis direction, and the two second base plate guide rails 35 extend along the Y-axis direction. In other words, the intermediate base plate 37 can be driven by the first linear transmission mechanism 16 to move along the X-axis direction, and the rotary motor base plate 17 is drivable by the second linear transmission mechanism 36 to move along the Y-axis direction.

The linear drive module 323 drives the platform 121 to move along the Y-axis direction and the X-axis direction, so that the platform 121 and the first probe assembly 14A on the first gantry support 13A can measure all contact connection traces on a circuit board, and movement of the first probe assembly 14A on the first gantry support 13A along the X-axis direction can be further reduced, thereby improving test data disturbance caused by shaking of the transmission line 91 connected between a testing machine 90 and the first probe assembly 14A. In addition, the first gantry support 13A includes a first beam 131A. In an architecture (the linear drive module 123) in which the linear drive module 323 does not provide movement along the X-axis direction, probing stroke of the first probe assembly 14A is required to cover contacts of the to-be-tested circuit board, and a length of the first beam 131A along the X-axis direction is about thrice a length of the platform 121 along the X-axis direction. The linear drive module 323 makes the platform 121 movable along the X-axis direction, so that the probing stroke of the first probe assembly 14A can be reduced, in other words, the length of the first beam 131A along the X-axis direction can be reduced. Further, overall volume of the circuit board detection device can be reduced, for example, the length of the first beam 131A along the X-axis direction is less than thrice the width of the platform along the X-axis direction.

In conclusion, the circuit board detection device proposed in the present invention can effectively resolve a problem of test data disturbance of the traditional circuit board detection device, and can also have an effect of minimizing the circuit board detection device. Although technical content of the present invention is disclosed above through the embodiments, it is not intended to limit the present invention. Any slight changes and modifications made by anyone familiar with the art without departing from the spirit of the present invention should be covered by the scope of the present invention. Therefore, the scope of protection in the present invention shall be subject to the scope of the patent application.

What is claimed is:

1. A circuit board detection device, configured to perform electrical detection on a circuit board, wherein the circuit board detection device comprises:
   a base, comprising an upper surface;
   a stage assembly, arranged on the upper surface of the base, wherein the stage assembly comprises a platform, a rotary motor, and a linear drive module, the platform is arranged on the rotary motor, the rotary motor is arranged on the linear drive module, the linear drive module is arranged on the upper surface of the base, the platform is configured to carry the circuit board, the platform is driven by the linear drive module to move along a first axial direction, the platform is driven by the rotary motor to rotate within a range of 0 degrees to 360 degrees relative to a first rotation axis, the first rotation axis is perpendicular to the upper surface of the base and passes through a center of the platform, the platform has a width along the first axial direction, and a movement distance of the platform driven by the linear drive module along the first axial direction is less than twice the width of the platform;
   a first gantry support, fixed on the base and remaining stationary along the first axial direction, wherein the first gantry support comprises a first beam, the first beam extends along a second axial direction to span over the linear drive module, the second axial direction is parallel to the upper surface of the base and perpendicular to the first axial direction, and the first beam comprises a first probe guide rail; and
   at least one first probe assembly, connected to the first probe guide rail to be movable along the second axial direction through the first probe guide rail.

2. The circuit board detection device according to claim 1, wherein the at least one first probe assembly comprises a first mounting base and a first probe unit, the first mounting base is connected to the first probe guide rail, the first probe unit comprises a first probe base and a first probe, the first probe base is rotatably arranged on the first mounting base, the first probe is arranged on the first probe base, the first probe base is rotatable within a range of 0 degrees to 180 degrees relative to a second rotation axis, the second rotation axis is perpendicular to the upper surface of the base, the at least one first probe assembly comprises an adaptation base arranged on the first probe base and at least one intermediate transmission line, two ends of the intermediate transmission line each comprise a first connector and a second connector, the first connector is electrically connected to the first probe, and the second connector is fixed to the adaptation base.

3. The circuit board detection device according to claim 1, further comprising:
   a testing machine, located above the first gantry support; and
   a transmission line, wherein one end of the transmission line is connected to the testing machine, and the other end is connected to the at least one first probe assembly.

4. The circuit board detection device according to claim 3, further comprising:

a housing, comprising a top surface opening, wherein the base, the stage assembly, the first gantry support, and the at least one first probe assembly are arranged in the housing, wherein the testing machine is arranged outside the housing, the top surface opening is located above the first gantry support, one end of the transmission line is connected to the testing machine, and the other end penetrates into the housing through the top surface opening of the housing to be connected to the at least one first probe assembly.

5. The circuit board detection device according to claim 1, wherein the linear drive module comprises:

two first base plate guide rails, extending along the first axial direction and parallel to each other, wherein the first axial direction is parallel to the upper surface of the base;

a first linear transmission mechanism, arranged between the two first base plate guide rails; and a base plate, arranged on the first linear transmission mechanism and the two first base plate guide rails and capable of being driven by the first linear transmission mechanism to move along the first axial direction, wherein the base plate is parallel to the platform of the stage assembly, and the rotary motor of the stage assembly is arranged on the base plate of the linear drive module.

6. The circuit board detection device according to claim 1, wherein the linear drive module further comprises:

two first base plate guide rails, extending along the first axial direction and parallel to each other, wherein the first axial direction is parallel to the upper surface of the base;

a first linear transmission mechanism, arranged between the two first base plate guide rails;

an intermediate base plate, arranged on the first linear transmission mechanism and the two first base plate guide rails and capable of being driven by the first linear transmission mechanism to move along the first axial direction;

two second base plate guide rails, arranged on the intermediate base plate, wherein the two second base plate guide rails extend along the second axial direction and are parallel to each other, and the second axial direction is parallel to the upper surface of the base;

a second linear transmission mechanism, arranged on the intermediate base plate and located between the two second base plate guide rails; and a rotary motor base plate, arranged on the second linear transmission mechanism and the two second base plate guide rails and capable of being driven by the second linear transmission mechanism to move along the second axial direction, wherein the rotary motor base plate is parallel to the platform of the stage assembly, and the rotary motor of the stage assembly is arranged on the rotary motor base plate of the linear drive module.

7. The circuit board detection device according to claim 1, wherein the linear drive module further comprises:

two first base plate guide rails, extending along the second axial direction and parallel to each other, wherein the second axial direction is parallel to the upper surface of the base;

a first linear transmission mechanism, arranged between the two first guide rails;

an intermediate base plate, arranged on the first linear transmission mechanism and the two first base plate guide rails and capable of being driven by the first linear transmission mechanism to move along the second axial direction;

two second base plate guide rails, arranged on the intermediate base plate, wherein the two second base plate guide rails extend along the first axial direction and are parallel to each other, and the first axial direction is parallel to the upper surface of the base;

a second linear transmission mechanism, arranged on the intermediate base plate and located between the two second base plate guide rails; and a rotary motor base plate, arranged on the second linear transmission mechanism and the two second base plate guide rails and capable of being driven by the second linear transmission mechanism to move along the first axial direction, wherein the rotary motor base plate is parallel to the platform of the stage assembly, and the rotary motor of the stage assembly is arranged on the rotary motor base plate of the linear drive module.

8. The circuit board detection device according to claim 1, wherein the stage assembly further comprises:

a bottom plate, arranged on an upper surface of the platform, and comprising two side edges parallel to each other; and two side plates, opposite to each other and arranged upright on the two side edges of the bottom plate, wherein clamping members for clamping the circuit board are arranged on surfaces of the two side plates that are opposite to each other, the clamping member of each side plate has a same height relative to an upper surface of the bottom plate along a third axial direction, and the third axial direction is perpendicular to the upper surface of the bottom plate.

9. The circuit board detection device according to claim 1, further comprising:

a testing machine, fixed on a first beam of the first gantry support; and at least one transmission line, wherein one end of the transmission line is connected to the testing machine, and the other end is connected to the at least one first probe assembly.

10. The circuit board detection device according to claim 1, further comprising:

two gantry guide rails, arranged parallel to each other on the upper surface of the base and extending along the first axial direction;

a second gantry support, arranged on the two gantry guide rails and spaced apart from the first gantry support along the first axial direction, wherein the second gantry support comprises a second beam extending along the second axial direction, the second beam comprises a second probe guide rail, and the second gantry support moves along the first axial direction through the two gantry guide rails and maximum displacement along the first axial direction is less than half the width of the platform; and at least one second probe assembly, connected to the second probe guide rail to be movable along the second axial direction through the second probe guide rail, wherein the at least one second probe assembly comprises a second mounting base and a second probe unit, the second mounting base is connected to the second probe guide rail, the second probe unit comprises a second probe base and a second probe, the second probe base is rotatably arranged on the second mounting base, the second probe is arranged on the second probe base, the second probe base is rotatable within a range of 0 degrees to 180 degrees relative to a third rotation axis, and the third rotation axis is perpendicular to the upper surface of the base.

11. The circuit board detection device according to claim 1, wherein a shape of the platform is selected from a square, a rectangle, or a circle; when the shape of the platform is the square, the width of the platform is a length of any edge of the platform; when the shape of the platform is the rectangle, the width of the platform is a length of a longer edge of the platform; and when the shape of the platform is the circle, the width of the platform is a diameter of the platform.

\* \* \* \* \*